US009048141B2

(12) United States Patent
Lang et al.

(10) Patent No.: US 9,048,141 B2
(45) Date of Patent: Jun. 2, 2015

(54) METHOD FOR ALIGNING A BIOCHIP

(71) Applicant: Robert Bosch GmbH, Stuttgart (DE)

(72) Inventors: Christoph Lang, Cupertino, CA (US);
Arjang Hassibi, Santa Clara, CA (US);
Sam Kavusi, Menlo Park, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/780,241

(22) Filed: Feb. 28, 2013

(65) Prior Publication Data

US 2014/0242735 A1    Aug. 28, 2014

(51) Int. Cl.
*H01L 21/66* (2006.01)
*H01L 23/544* (2006.01)
*H01L 21/68* (2006.01)

(52) U.S. Cl.
CPC .............. *H01L 22/12* (2013.01); *H01L 23/544* (2013.01); *H01L 2223/54426* (2013.01); *H01L 2223/5448* (2013.01); *H01L 21/68* (2013.01)

(58) Field of Classification Search
CPC ...................... H01L 21/68; H01L 2223/54426; H01L 2223/5448; H01L 23/544
USPC .............. 422/50, 62, 63; 435/4, 286.2, 287.1, 435/288.7; 204/461, 472, 470, 556, 192.13, 204/192.25, 192.26, 192.33, 400, 403.01, 204/403.03, 229.8, 230.8
See application file for complete search history.

(56) References Cited

U.S. PATENT DOCUMENTS

| 5,874,724 | A  | * | 2/1999  | Cato .............................. 235/492 |
| 6,673,315 | B2 | * | 1/2004  | Sheridan et al. ................ 422/50 |
| 6,902,897 | B2 |   | 6/2005  | Tweedie et al. |
| 7,199,719 | B2 | * | 4/2007  | Steinberg ................... 340/572.8 |
| 7,224,474 | B2 |   | 5/2007  | Chuang et al. |
| 7,960,183 | B2 |   | 6/2011  | Koeda |
| 7,961,323 | B2 |   | 6/2011  | Tibbetts |
| 2004/0075099 | A1 |   | 4/2004  | Matsumoto et al. |
| 2005/0214775 | A1 |   | 9/2005  | Adaskin et al. |
| 2007/0040683 | A1 | * | 2/2007  | Oliver et al. ................ 340/572.1 |
| 2007/0046369 | A1 | * | 3/2007  | Schober et al. ..................... 330/7 |
| 2008/0284530 | A1 | * | 11/2008 | Pellerano et al. ............. 331/1 A |
| 2009/0071829 | A1 | * | 3/2009  | O'Banion et al. ............ 204/461 |
| 2009/0088338 | A1 |   | 4/2009  | Liu et al. |
| 2010/0304509 | A1 | * | 12/2010 | Aghababazadeh et al. ..... 438/17 |
| 2013/0143675 | A1 | * | 6/2013  | Platzer ............................ 463/58 |

OTHER PUBLICATIONS

International Search Report and Written Opinion corresponding to PCT Application No. PCT/US2014/018200, mailed Jun. 5, 2014 (10 pages).

* cited by examiner

*Primary Examiner* — Brett Feeney
*Assistant Examiner* — Sophia Nguyen
(74) *Attorney, Agent, or Firm* — Maginot Moore & Beck LLP

(57) ABSTRACT

A method of aligning a semiconductor chip includes forming a semiconductor chip with a light-activated circuit including at least one photosite, positioning the semiconductor chip relative to a device, and illuminating the positioned semiconductor chip. The method further includes generating an RF signal with an RF circuit based upon illumination of the at least one photosite, and determining the position of the photosite with respect to the device based upon the generated RF signal.

17 Claims, 13 Drawing Sheets

METHOD FOR ALIGNING A BIOCHIP

FIELD

This disclosure relates to processing of semiconductor devices.

BACKGROUND

Biochips are semiconductor devices that include biological material spotted on a substrate. The biochip functions as a sensor for a particular type of molecule, such as genes, proteins, carbohydrates, cell tissues, lipids, and the like. Biochips are capable of fast and convenient bio-chemical detection; therefore, biochips are frequently used in bio-chemical analysis applications, such as diagnostic testing both at the point of care and at a care provider location.

The biological material of a biochip is typically densely spotted onto the substrate in an organized pattern referred to as an array or matrix. The array typically has an area of approximately 1 $mm^2$ to 40 $cm^2$. A spot of the biological material, referred to as a bio-probe, is typically no snore than 500 µm in diameter. Often each bio-probe has a physical address within the array to enable a detection apparatus to associate a molecule sensed by the biochip with a particular one of the bio-probes. Accuracy ceded in alignment ranges between 500 nm-50 um.

Methods for spotting the biological material onto the substrate of the biochip, include contact spotting and non-contact jet printing, among other methods. In contact spotting, the bio-probes are directly spotted onto the substrate with numerous mechanical pins. In non-contact jet printing the bio-probes are "printed" onto the substrate of the biochip similar to the way in which an ink-jet printer prints an image.

To perform the contact spotting and non-contact jet printing methods described above, it is necessary to align the biochip with a post-processing device before the biological material is spotted or printed. This is because the area of the biochip configured to receive the biological material includes numerous electrodes or wells organized in an array, and each bio-probe should be deposited onto one of the electrodes.

A known method of aligning the post-processing device includes using a camera system to visually inspect the biochip fir one or more alignment marks formed on the biochip. After registering the location and the angle of the alignment marks spotting of the biological material is performed.

The above-described camera alignment method aligns the biochip with the post-processing device well enough for most applications. The camera alignment method, however, is costly to employ and results in low throughput of the biochips. Therefore, improvements in the method used to align a biochip with a post-processing device are desirable.

SUMMARY

According to one embodiment of the disclosure, a method of aligning a semiconductor chip includes forming a semiconductor chip with a light-activated circuit including at least one photosite, positioning the semiconductor chip relative to a device, and illuminating the positioned semiconductor chip. The method further includes generating an RF signal with an RF circuit based upon illumination of the at least one photosite, and determining the position of the photosite with respect to the device based upon the generated RF signal.

BRIEF DESCRIPTION OF THE FIGURES

The above-described features and advantages, as well as others, will be more readily apparent to those of ordinary skill in the art by reference to the following detailed description and the accompanying figures in which.

DETAILED DESCRIPTION

Figure 1:
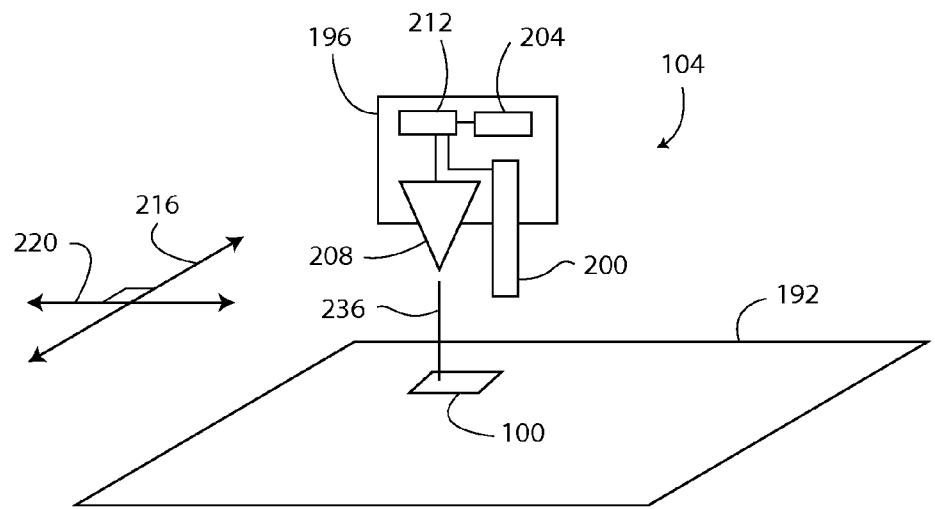
FIG. 1 is a block diagram of a post-processing device and a biochip as described herein.

For the purpose of promoting an understanding of the principles of the disclosure, reference will now be made to the embodiments illustrated in the drawings and described in the following written specification. It is understood that no limitation to the scope of the disclosure is thereby intended. It is further understood that the disclosure includes any alterations and modifications to the illustrated embodiments and includes further applications of the principles of the disclosure as would normally occur to one skilled in the art to which this disclosure pertains.

As shown in FIG. 1, a semiconductor chip 100 is positioned on a post-processing device/machine generally designated 104. The post-processing device 104 automatically aligns itself in the proper orientation for processing the semiconductor chip 100, as explained in detail below.

Figure 2:
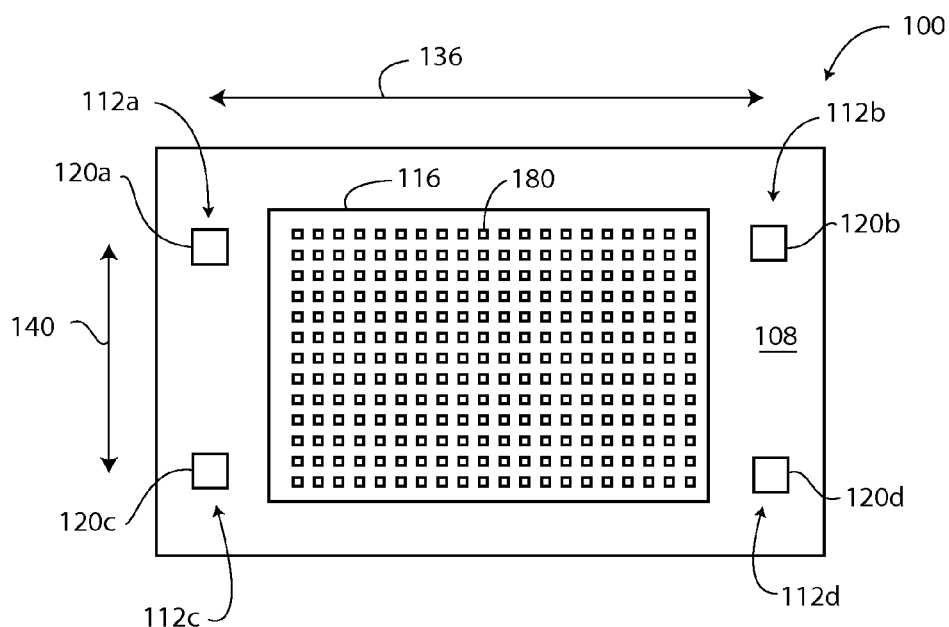
FIG. 2 is top plan view of the biochip of FIG. 1.

With reference to FIG. 2, the semiconductor chip 100 is a biochip that includes a substrate 108, four light-activated circuits 112, and a biosensor array 116. The substrate 108 is formed from silicon. The light-activated circuits 112 and the biosensor array 116 are formed on the substrate 108 using complementary metal oxide semiconductor (CMOS) technology. The substrate 108 has dimensions of approximately 5 cm×3 cm×0.2 cm.

Figure 3:
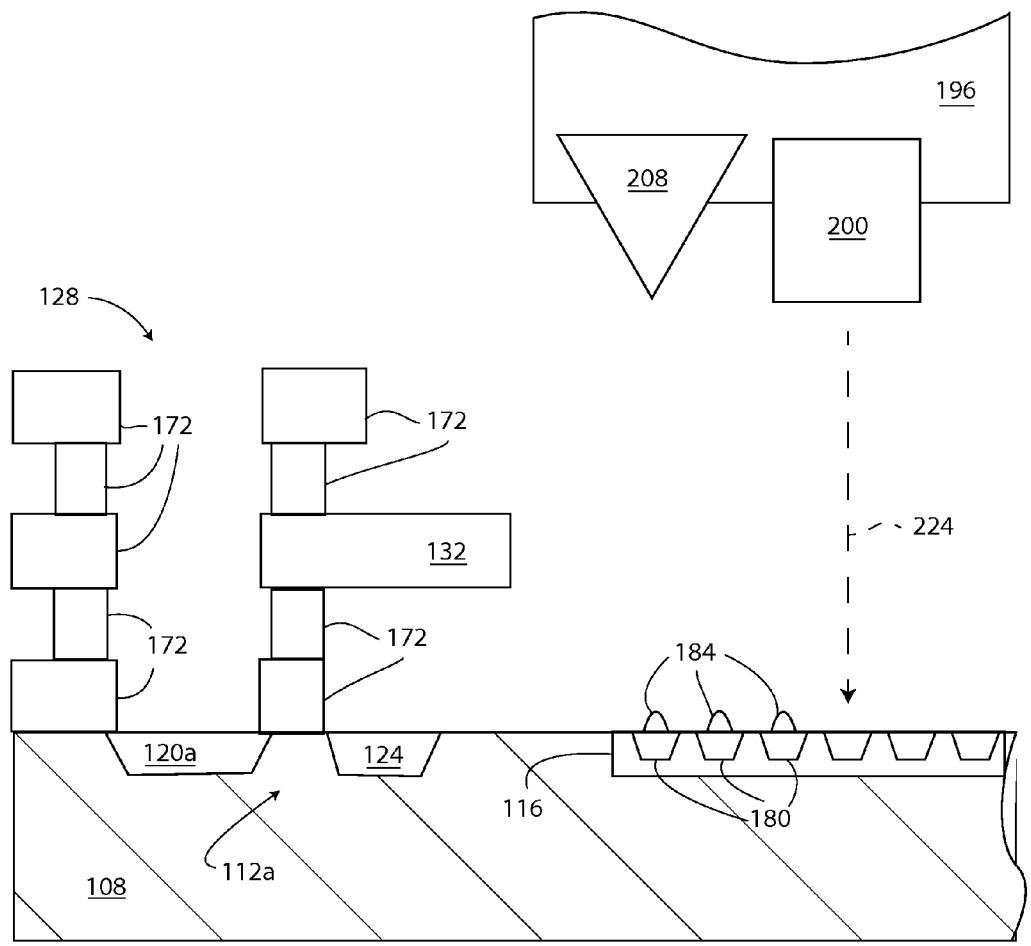
FIG. 3 shows a cross sectional view of a portion of the biochip and a portion of the post-processing device of FIG. 1.

As shown in FIG. 3, the light-activated circuit 112a (which is substantially identical to the other light-activated circuits 112b, 112c, and 112d) includes a photosite 120a, a radio frequency ("RF") circuit 124, a waveguide 128, and a light shield 132. The photosite 120a (also shown in FIG. 2) is a portion of the substrate 108 that is electrically responsive to illumination. The photosite 120a has an approximately square shape as viewed from above. The photosite 120a is arranged near a corner of the substrate 108.

The photosite 120a is spaced apart from the photosite 120b by a distance 136. Similarly, the photosite 120c is spaced apart from the photosite 120d by the same distance 136. The photosite 120a is spaced apart from the photosite 120c by a distance 140. Likewise, the photosite 120b is spaced apart from the photosite 120d by the same distance 140.

Figure 4:
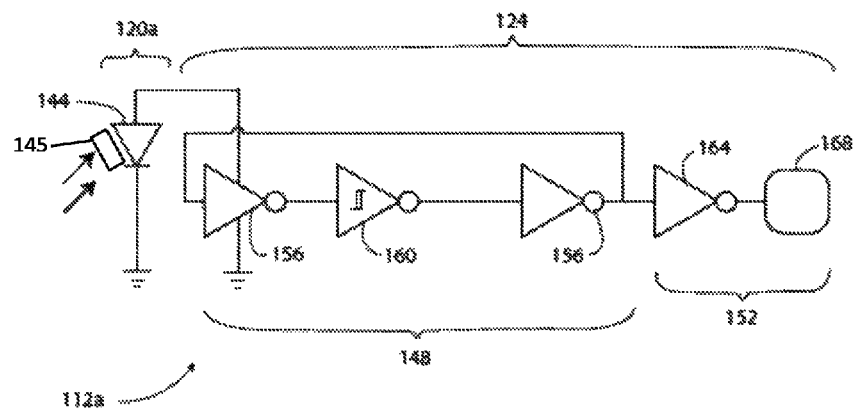
FIG. 4 is a schematic view of a light-activated circuit of the biochip of FIG. 1.

As shown in FIG. 4, the photosite 120a includes a photodiode 144 configured in photovoltaic mode. The photodiode 144 is operatively connected to the RF circuit 124. In response to being illuminated, the photodiode 144 generates a voltage having a magnitude that that is based on the intensity of the illumination. The voltage generated by the photodiode 144 powers the RF circuit 124.

With continued reference to FIG. 4, the RF circuit 124 includes a ring oscillator 148 and an emitter circuit 152. The ring oscillator 148 includes an odd number of components. In the illustrated embodiment the ring oscillator 148 includes two inverters 156 and one Schmitt trigger 160; however, the ring oscillator includes any odd number of components in practice. The photodiode 144 is electrically connected to the inverters 156 and the Schmitt trigger 160, even though only the electrical connection to the left-most inventor 156 is shown.

The ring oscillator 148 generates an electrical output that oscillates between two voltage levels. The frequency and the amplitude of the electrical output is based at least in part on the intensity of the light incident on the photodiode 144 and the delay of the gates that form the inverters 156 and the Schmitt trigger 160. The ring oscillator 148 is configured to generate an output in the radio frequency range.

The emitter circuit 152 includes an inverter 164 and an electrode 168. The output of the ring oscillator 148 is connected to the input of the inverter 164. The output of the inverter 164 is connected to the electrode 168, which functions as an antenna. The electrode 168 is formed near the surface of the substrate 108. Accordingly, in response to illumination of the photosite 120, the RF circuit 124 emits a radio frequency signal from the electrode 168.

With reference again to FIG. 3, the waveguide 128 extends above the photosite 120a. The waveguide 128 is formed from metallization layers 172 deposited onto the substrate 108. The waveguide 128 functions as a light window that passes light in a shape that approximately matches the shape of the photosites 120 (i.e. generally square).

The light shield 132 is also formed from metallization layers 172 deposited onto the substrate 108 of the semiconductor chip 100. The light shield 132 is positioned above the RF circuit 124. Since the light shield 132 is at least partially formed from metal, the light shield blocks the passage of light. Accordingly, the light shield 132 prevents light emitted from above the substrate 108 from illuminating the RF circuit 132. This prevents oscillations of the ring oscillator 148 from being affected by illumination from above.

While the waveguide 128 effectively protects against direct illumination of the photosite 120 from light sources other than a desired light source, in some embodiments protection from unintended light sources is provided additionally or alternatively by an optical filter 145. In one embodiment, the optical filter 145 is a color filter configured to allow only a desired wavelength of light to illuminate the photosite 120.

Figure 5:
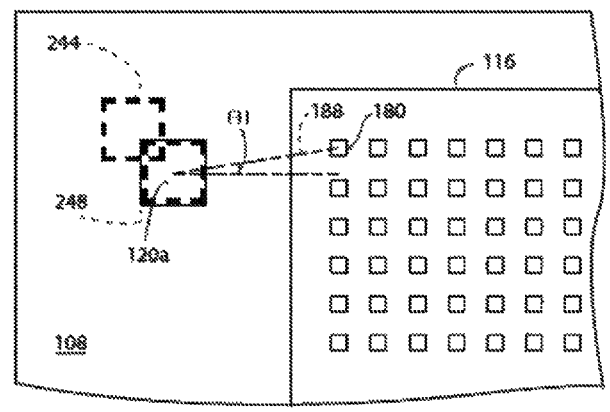
FIG. 5 is a top plan view of a portion of the biochip of FIG. 1, showing an illumination outline in two different positions.

As shown in FIG. 2, the biosensor array 116 is positioned on the substrate 108 between the light-activated circuits 120. The biosensor array 116 includes numerous wells or electrodes 180 and bio-probes 184 (FIG. 3). The electrodes 180 are arranged in an array of rows and columns on a Cartesian grid. The electrodes 180 are evenly spaced apart from each other, such that if the spacing between the electrodes is known, then the distance between any two electrodes is calculable. Also, at least one electrode 180 is positioned at a known angle and distance from at least one of the light-activated circuits 120. As shown in FIG. 5, the electrode 180 is positioned a distance 188 and an angle θ1 from the center of the light-activated circuit 120a. The position of each electrode 180 from the center of the light-activated circuit 120a is describable as a vector quantity including a magnitude and a direction measured from the center of the light-activated circuit 120a. This information is typically made available in a datasheet associated with the semiconductor chip 100.

With reference to FIG. 3, the bio-probes 184 are typically formed from a capturing agent such as a nucleic acid. Each of the bio-probes 184 is positioned on one of the electrodes 180 by the post-processing device 104. The bio-probes 184 are configured to capture a biomolecule of interest, in a manner known to those of ordinary skill in the art. The capturing agent is also referred to herein as a biomaterial.

As shown in FIG. 1, the post-processing device 104 includes a table 192 and a printing machine, provided as a spotting structure 196, positioned above the table. The table 192 defines a generally flat surface on which the semiconductor chip 100 is positioned. When the semiconductor chip 100 is positioned on the table 192, the semiconductor chip is prevented from moving relative to the table. In some embodiments, the table 192 includes a registration slot (not shown) configured to receive the semiconductor chip 100 in a particular orientation.

The spotting structure 196 includes a spotter 200, a receiver 204, a light source 208, and a controller 212 each of which are connected to the spotting structure. The spotting structure 196 is movable relative to the table 192 and the semiconductor chip 100 in the direction 216 and the direction 220. In other embodiments, the table 192 is movable relative to the spotting structure 196 in the direction 216 and the direction 220.

The spotter 200 is electrically connected to the controller 212 and is configured to eject or jet biomaterial onto specific locations of the semiconductor chip 100 to form the bio-probes 184. The biomaterial follows the path 224 (FIG. 3) as it is ejected onto the electrodes 180 from the spotter 200. The spotter 200 is configurable to eject a desired mass of biomaterial that is suitable for the size of the electrodes 180.

The receiver 204 is electrically connected to the controller 212. The receiver 204 receives the RF signal generated by the light-activated circuits 112. In response to receiving the RF signal, the receiver 204 generates a receiver output signal that is sent to the controller 212. The receiver 204 is configurable to generate the output signal in response to a certain frequency of the RF signal and/or a certain amplitude of the RF signal. Additionally, the output signal is variable depending on the amplitude and frequency of the RF signal.

Figure 6:
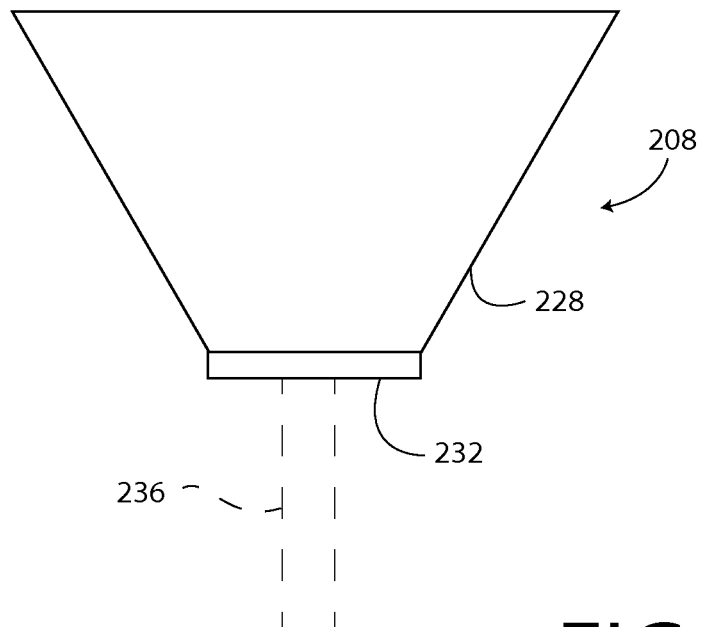
FIG. 6 is an front elevational view of a light source of the post-processing device of FIG. 1.

As shown in FIG. 6, the light source 208 includes a light emitter 228 and an aperture piece 232. The light emitter 228 generates a focused light beam 236, such as a laser beam. The wavelength of the focused light beam 236 causes the photodiode 144 to generate a voltage, when the light beam illuminates the photosite 120. The light emitter 228 is electrically connected to the controller 212.

Figure 7:
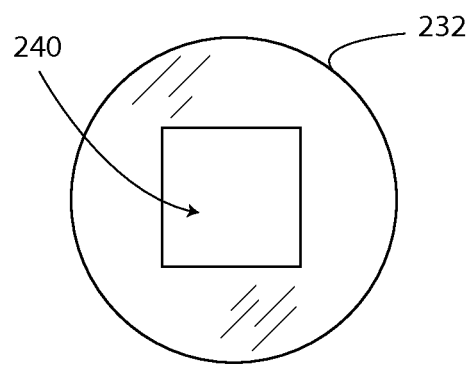
FIG. 7 is top plan view of an aperture of the light source of FIG. 6.

The aperture piece 232 is connected to the light emitter 228 and defines an aperture 240 (see FIG. 7). The aperture 240 defines a generally square periphery. Accordingly, as the focused light beam 236 passes through the aperture 240, the focused light beam takes the shape of the aperture. The size of the aperture 240 is approximately the same size as the opening defined by the waveguide 128, such that the resulting focused light beam 236 is sized to illuminate approximately the entire photosite 120 when the light beam is centered above the photosite. Also, the aperture 240 causes the light beam 236 to have a shape that is complementary to the shape of the photosite 120.

The controller 212 is an electrical device that is operatively connected to a motorized unit (not shown), which moves the spotting structure 196 in the direction 216 and the direction 220. The controller 212 generates electrical signals that cause the motorized unit to move the spotting structure 196 in a controlled manner. The controller 212 runs a program that enables the controller to determine the position of each of the electrodes 180.

Figure 8:
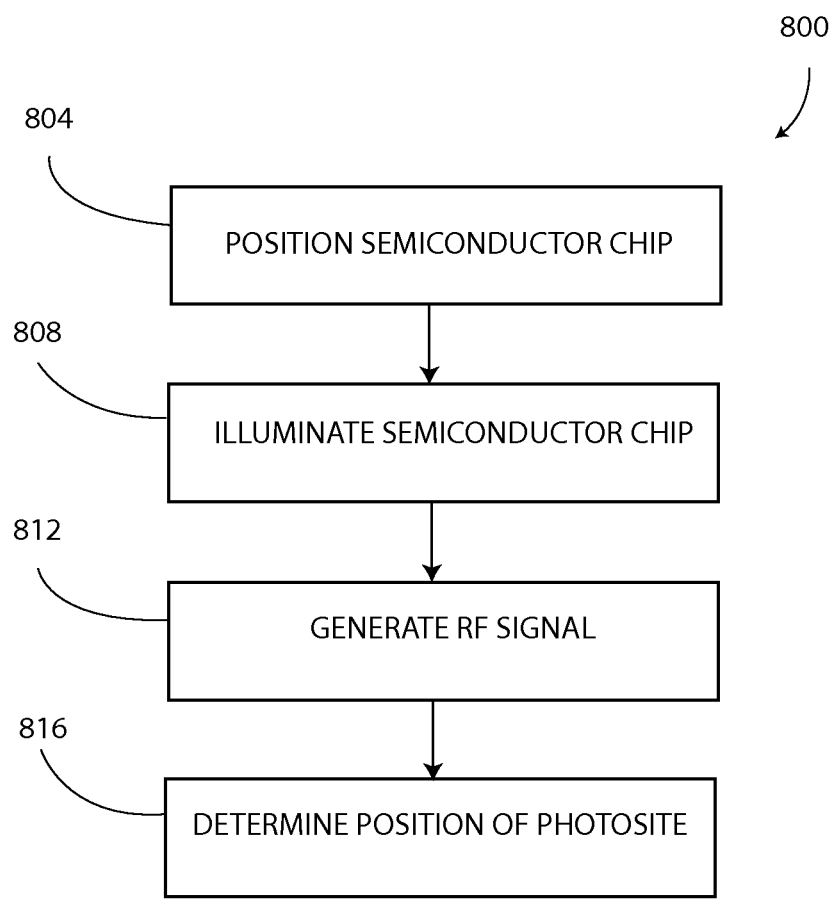
FIG. 8 is a flowchart illustrating a method of operating the post-processing device of FIG. 1.

In operation, the post-processing device 104 accurately aligns the spotter 200 to deposit the bio-probes 184 onto the electrodes 180 of the semiconductor chip 100, according to the method 800 shown in FIG. 8. As shown in block 804, first the semiconductor chip 100 is positioned on the table 192. Often the semiconductor chip 100 is placed in approximately a regular position on the table 192. Due to the extremely small scale of the semiconductor chip 100; however, even a slight variation in the position of the semiconductor chip 100 could result in alignment errors of the post-processing device 104. For this reason, the post-processing device 104 performs the alignment and disambiguation process described below.

After positioning the semiconductor chip 100 the controller 212 is programmed with information related to the particular semiconductor chip that has been placed on the table 192. Typically, the information programmed into the controller 212 includes the dimensions of the semiconductor chip 100, the position of the photosites 120, the number of photosites, the area of the photosites, the position of the biosensor array 116 in relation to the photosites, and the number and position of the electrodes in the biosensor array 116, among other information. The above-described information may be stored in an electronic file that is transmitted to the controller 212, to prevent a user from having to manually enter the data. Also, the programming step is performable before placement of the semiconductor chip 100 on the table 192, if the user so desires. In another embodiment, the above-described information is stored in a memory module (not shown) of the semiconductor chip 100. The above-described information is transmitted wirelessly from the semiconductor chip 100 to the receiver 204 or the controller 212. The memory module is provided as a radio frequency identification tag (RFID).

Next, as shown in block 808 of FIG. 8, the post-processing device 104 illuminates the semiconductor chip 100 with the light source 208. The spotting structure 196 and the light source 208 are initially positioned in a location that is likely to cause the light source to at least partially illuminate the photosite 120a. Often, the initial position of the spotting structure 196 is associated with the position of the photosite 120a from a previously processed semiconductor chip 100. Depending on the placement of the present semiconductor chip 100, however, the spotting structure 196 and the photosite 120a may not be aligned.

By way of example, the light beam 236 cast by the light source 208 is shown by an illumination outline 244 and an illumination outline 248 in FIG. 5. The illumination outline 244 represents the position of the light beam 236 when the light source 208 is initially illuminated. The illumination outline 248 represents the position of the light beam 236 when the spotting structure 196 has determined the exact position of the photosite 120a and moved the spotting structure to be aligned with the photosite 120a.

As shown by the illumination outline 244, the light beam 236 initially illuminates the upper left hand corner of the photosite 120a. This illumination causes the photodiode 144 to supply power to RF circuit 124. When the RF circuit 124 is supplied with power, it emits the RF signal from the electrode 168. The receiver 204 receives the RF signal and generates an output.

Since only a portion of the photosite 120a is illuminated, the photodiode 144 does not generate as much voltage as it would if it were fully illuminated. As a result, the amplitude of the RF signal emitted by the emitter 168 is less than it would be if the photosite 120a is fully illuminated. Also, the frequency of the RF signal is different than it would be if the photosite 120a were fully illuminated (typically the frequency is lower when the photosite is not fully illuminated). Accordingly, the receiver 204 configures the receiver output signal to indicate to the controller 212 that the light beam 236 is partially illuminating the photosite 120a.

Next, as shown in block 816 of FIG. 8, the controller 212 determines the exact position of the center of the photosite 120a. To do this, the controller 212 causes the spotting structure 196 to move relative to the semiconductor chip 100 until the light beam 236 illuminates as much of the photosite 120a as possible based on the orientation of the semiconductor chip. Since in the exemplary orientation shown in FIG. 5, the semiconductor chip 100 is orthogonally oriented with respect to the light beam 236, the light beam is movable to a position in which the entire photosite 120a is illuminated. The controller 212 runs a program to find the position of the spotting structure 196 that causes the entire photosite 120a to be illuminated.

When determining the position of the center of the photosite 120a, the controller 212 automatically moves the spotting structure 196 according to a predetermined pattern. The pattern causes the light beam 236 to move outwardly from its initial position in an overlapping spiral pattern. In another embodiment, the controller 212 moves the spotting structure 196 according to a different pattern. In yet another embodiment, the spotting structure 196 is moved manually by an operator of the post-processing device 104.

As the controller 212 causes the spotting structure 196 to move it monitors the receiver output signal. The spotting structure 196 is moved until the controller 212 determines the position of the spotting structure that results in a maximum amplitude of the RF signal generated by the RF circuit 124. In the example illustrated in FIG. 5, the maximum amplitude occurs when the photosite 120a is fully illuminated by the light beam 236 (as shown by the illumination outline 248). When the controller 212 determines that the photosite 120a is fully illuminated (or is illuminated as much as possible), the controller moves the spotting structure 196 to the position that resulted in the maximum amplitude of the RF signal.

Next, the controller 212 stores the position of the spotting structure 196 that corresponds to the photosite 120a being fully illuminated. Typically, the controller 212 stores two values that represent a two-dimensional position of the spotting structure 196 on a virtual Cartesian grid. The stored position represents very accurately the center of the photosite 120a.

Figure 9:
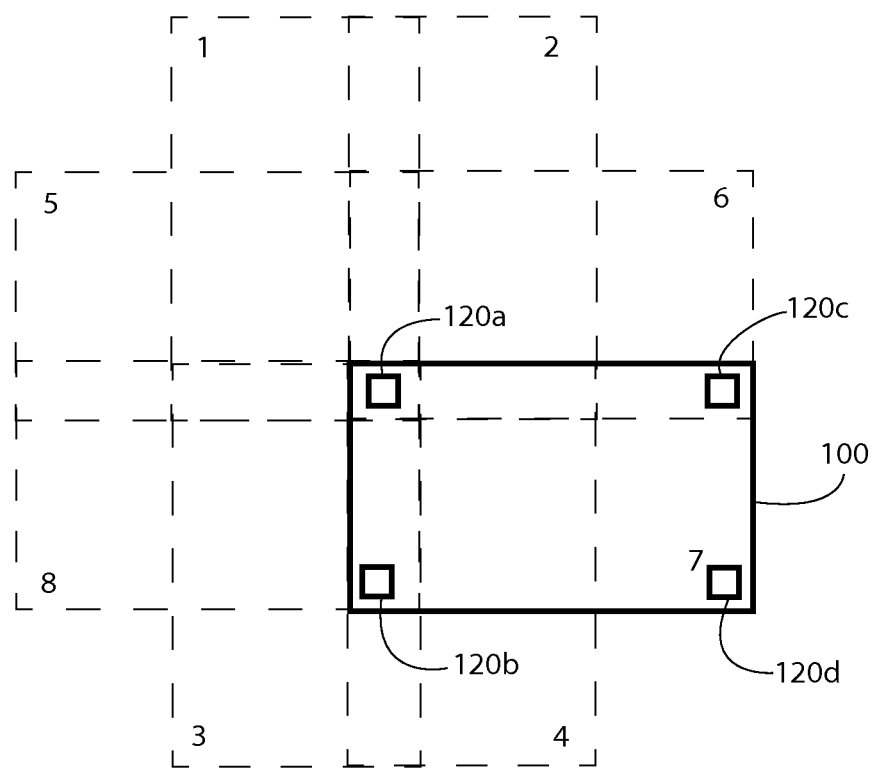
FIG. 9 is a top plan view of the biochip of FIG. 1 showing the biochip in eight different orientations, in seven of the orientations the biochip is shown in broken lines.

With reference to FIG. 9, next the controller 212 disambiguates the orientation of the semiconductor chip 100 on the table 192. Up to this point, the controller 212 has determined only the location of one of the photosites 120 (i.e. photosite 120a). The controller 212 next determines the location of at least two other photosites 120 in order to disambiguate the orientation of the semiconductor chip 100. That is, the semiconductor chip 100 is in one of the eight possible orientations shown in FIG. 9; the controller 212 determines the locations of the other photosites 120 in order to deduce in which one of the orientations the semiconductor chip is positioned. In the example described below, the semiconductor chip 100 is positioned in the orientation labeled "7".

The disambiguation process begins with the controller 212 causing the spotting structure 196 to move to the possible position of another one of the photosites 120. In general, the controller 212 causes the spotting structure 196 to move the distance 136 in the left or right direction or to move the distance 140 in the up or down direction. After moving the distance 136 or the distance 140 the light source 208 is illuminated and the controller 212 monitors the receiver 204 for the detection of the RF signal. If the RF signal is not detected, then two orientations of the semiconductor chip 100 are eliminated and the spotting structure 196 is moved to the likely position of another one of the photosites 120. If the RF signal is detected, then six orientations of the semiconductor chip 100 are eliminated and the spotting structure 196 is moved to the likely position of another one of the photosites 120.

In this example, the spotting structure 196 is moved from the photosite 120a the distance 140 in the downward direction. The photosite 120b is present at the new location of the spotting structure 196. Therefore, when the light source 208 is illuminated, the receiver 204 indicates the presence of the RF signal to the controller 212. After receiving the output signal from the receiver 204 indicating the presence of the RF signal, the controller 212 eliminates orientations 1-6 of the semiconductor chip as possible orientations leaving only orientation 7 and 8 as possibilities.

To continue this example, to further disambiguate the orientation of the semiconductor chip 100, the spotting structure 196 is moved from the photosite 120b the distance 136 to the left. This positions the light source 208 over a portion of the table 192 on which the semiconductor chip 100 is not positioned. Accordingly, when the light source 208 is illuminated no RF signal is generated in response thereto. As a result, the controller 212 determines the semiconductor chip 100 is not in orientation 8 and, by process of elimination, the controller deduces that the semiconductor chip is in orientation 7, as shown in bold in FIG. 9.

After completing the disambiguation process the post-processing device 104 has determined the two-dimensional orientation of the semiconductor chip 100. Additionally, based on the detected position of the center of the photosite 120a and the programmed information, the post-processing device 104 is able to calculate the position of each of the electrodes 180 on which to deposit the bioprobes 184.

Next, the post-processing device 104 is ready to spot the biomaterial onto the biosensor array 116. Since the spotter 200 is positioned a known distance from the light source 208, the controller 212 is able to position the spotter directly over any one of the electrodes 180. In this way, the post-processing device 104 is able to accurately align the spotter 200 with the electrodes 180 formed on the semiconductor chip 100.

To spot the biomaterial, the controller 212 causes the motorized unit to move the spotter 200 to a position that is directly above an electrode 180 that is to receive the biomaterial. The spotter 200 then jets a predetermined amount of the biomaterial precisely onto the electrode 180. This process is repeated for each of the electrodes 180 that are to receive biomaterial.

Figure 10:
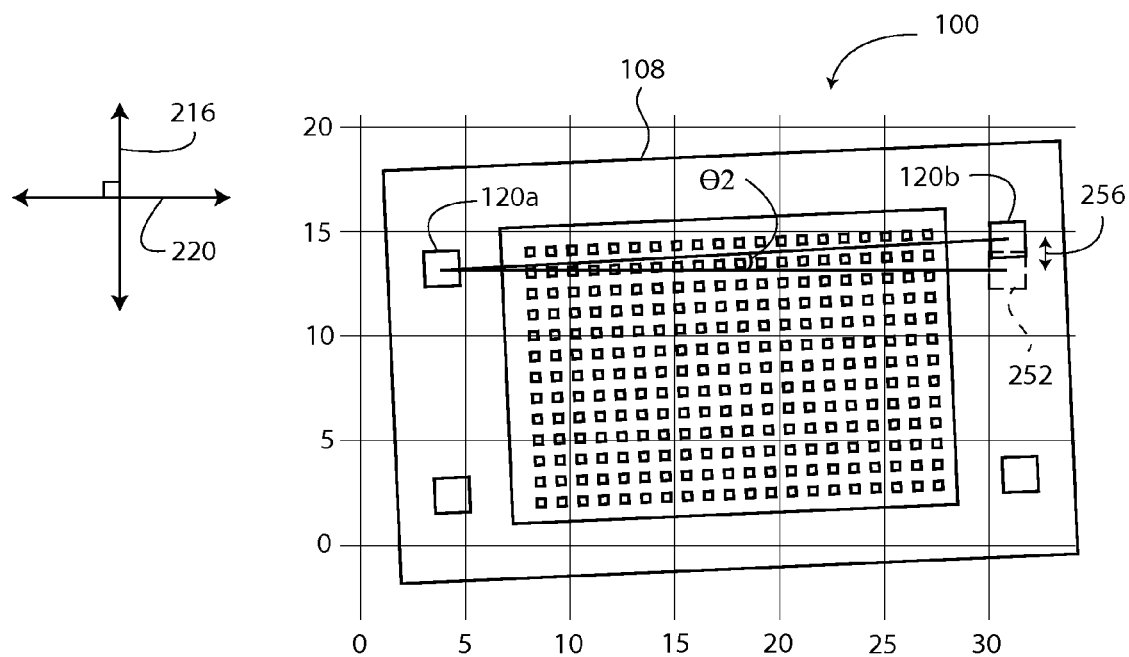
FIG. 10 is a top plan view of the biochip of FIG. 1 with the biochip positioned in a skewed orientation.

As shown in FIG. 10, in another positioning example the semiconductor chip 100 is positioned on the table 192 (not shown in FIG. 10) in a skewed orientation instead of the orthogonal position shown in FIG. 5. In this skewed orientation, the post-processing device 104 performs an angle-correction process when determining the position of the semiconductor chip 100. To illustrate the skewed orientation, FIG. 10 includes a virtual coordinate system overlaid on the semiconductor chip 100. The vertical lines of the coordinate system are parallel to the direction 216 and perpendicular to the direction 220. Additionally, the horizontal lines of the coordinate system are parallel to the direction 220 and perpendicular to the direction 216.

To begin, the controller 212 determines the position of the photosite 120a. According to the numbering of the grid overlay of FIG. 10, the controller 212 determines that the photosite 120a is located at approximately (4, 13). The stored position represents approximately the center of the photosite 120a.

Next, the controller 212 begins the disambiguation process by causing the spotting structure 196 to move to the possible position of another one of the photosites 120. In this example, the controller 196 causes the spotting structure 196 to move from the photosite 120a the distance 136 to the right to approximately the position (31, 13) as shown by the illumination outline 252. If the semiconductor chip 100 were in the orientation shown in FIG. 5, then the photosite 120b would be positioned directly under the illumination outline 252. Due to the skewed angle of the semiconductor chip 100, however, the illumination outline 252 encompasses only a portion of the photosite 120b.

Thereafter, the controller 212 causes the spotting structure 196 to move in the spiral pattern until the receiver 204 detects the RF signal that is associated with full illumination of the photosite 120b. When the controller 212 determines that approximately a maximum level of RF is being received by the receiver 204, the controller stores the position of the photosite 120b, which, in the illustrated example, is approximately (31, 14).

After storing the position of the photosite 120a and the photosite 120b the controller 212 accounts for a skew angle θ2 of the semiconductor chip 100. To do this, first the controller 212 determines the distance 256, which is the distance between the expected position of the photosite 120b (represented by the center of the illumination outline 252) and the actual position of the photosite 120b. Next, the controller 212 refers to a lookup table which associates the distance 256 with a magnitude of the angle θ2.

Using the angle θ2 and the known dimensions and layout of the semiconductor chip 100, the controller 212 is able to calculate the position of each electrode 180 of the biosensor array 116 even though the semiconductor chip is skewed. Accordingly, the angle-correction process enables the post-processing device 104 to accurately deposit biomaterial onto a semiconductor chip 100 that is in a skewed orientation on the table 192.

Figure 11:
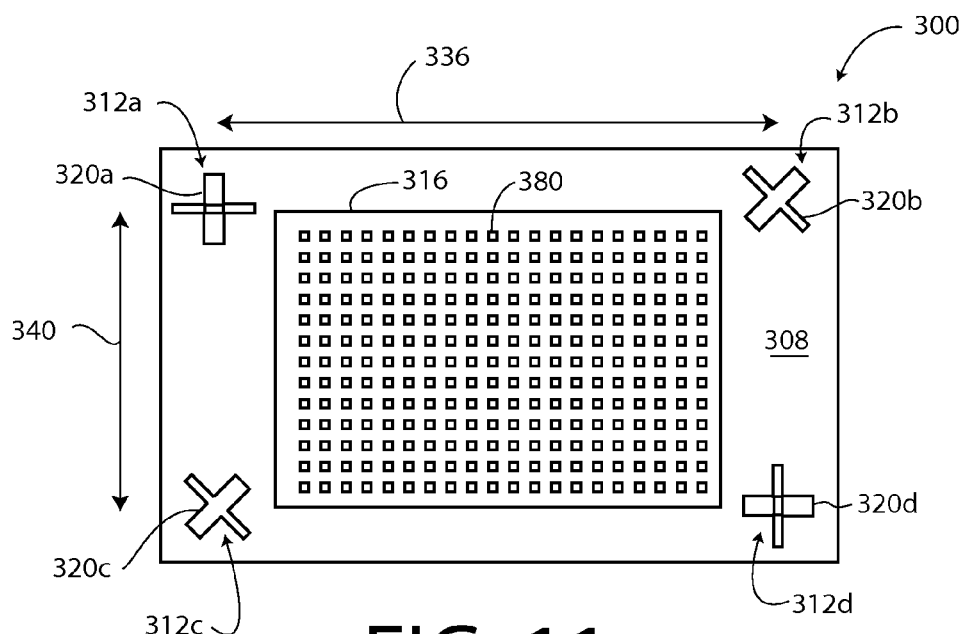
FIG. 11 is a top plan view of another embodiment of the biochip of FIG. 1 including four asymmetrical cross-shaped photosites.

As shown in FIG. 11, another embodiment of the semiconductor chip 300 includes a substrate 308, four light-activated circuits 312, and a biosensor array 316. The substrate 308 is formed from silicon. The light-activated circuits 312 and the biosensor array 316 are formed on the substrate 308 using complementary metal oxide semiconductor (CMOS) technology.

Figure 12:
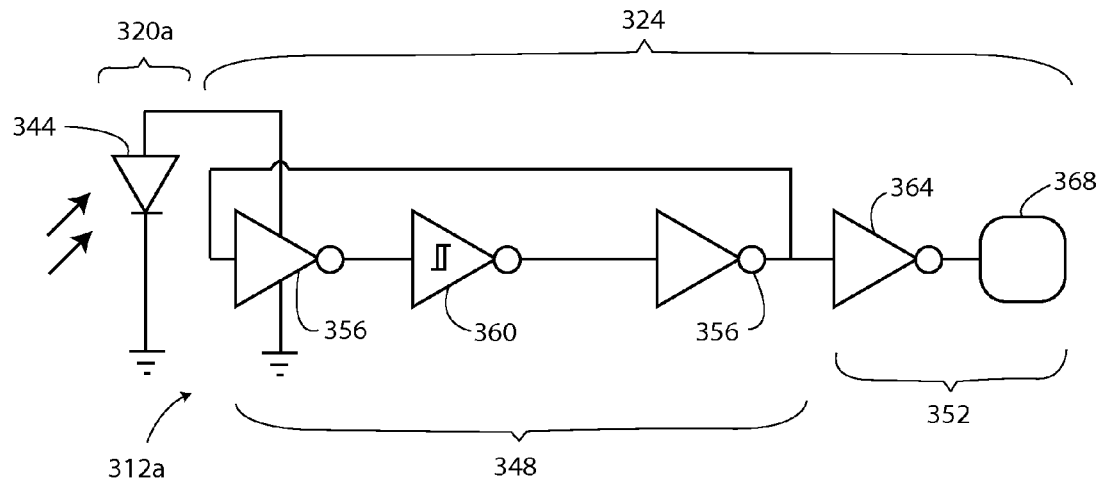
FIG. 12 is a schematic view of a light-activated circuit of the biochip of FIG. 11.

As shown in FIG. 12, the light-activated circuit 312a includes a photosite 320a and a radio frequency ("RF") circuit 324. The photosite 320a is a portion of the substrate 308 that is electrically responsive to illumination. The photosite 320a includes a photodiode 344 configured in photovoltaic mode. The photodiode 344 is operatively connected to the RF circuit 324.

The RF circuit 324 includes a ring oscillator 348 and an emitter circuit 352. The ring oscillator 348 includes an odd number of components. In the illustrated embodiment the ring oscillator 348 includes two inverters 356 and one Schmitt trigger 360; however, the ring oscillator includes any odd number of components in practice. The photodiode 344 is electrically connected to the inverters 356 and the Schmitt trigger 360, even though only the electrical connection to the left-most inventor 356 is shown.

The emitter circuit 352 includes an inverter 364 and an electrode 368. The output of the ring oscillator 348 is connected to the input of the inverter 364. The output of the inverter 364 is connected to the electrode 368, which functions as an antenna. The electrode 368 is formed near the surface of the substrate 308. Accordingly, in response to illumination of the photosite 320, the RF circuit 324 emits a radio frequency signal from the electrode 368.

Figure 13:
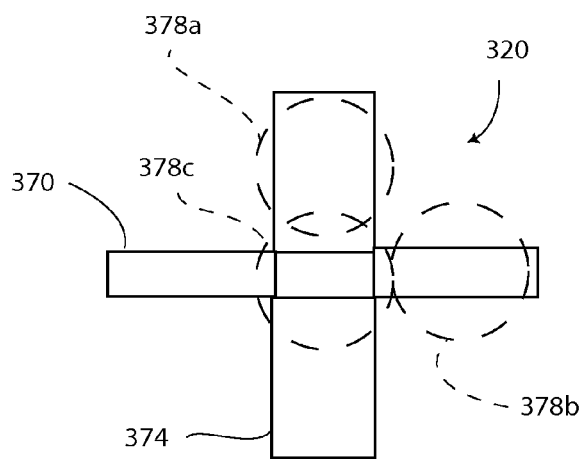
FIG. 13 is a top plan view showing one of the photosites of FIG. 11 and also showing an illumination pattern in three different positions.

As shown in FIG. 13, the photosites 320 have a generally cross shape as viewed from above. In particular, the photosite 320 includes a narrow cross member 370 and a wide cross member 374, such that the shape of the photosite is more specifically an asymmetrical cross shape. This shape enables the photosite 320 to emit an RF signal that is dependent on the angle and the distance of the photosite from the light beam 236 of the light source 208. The photosites 320 are each the same shape, but the photosites 320b and 320c are in a rotated orientation as compared to the photosites 320a and 320d.

As shown by the illumination outlines 378, which represent the light beam 236 from the light source 208, a different portion of the light beam 236 is used to illuminate the photosite 320 depending on if the light source 208 is illuminating the narrow cross member 370, the wide cross member 378, or the center of the photosite. Specifically, as shown by the illumination outline 378a, when the light beam 236 illuminates a portion of the wide cross member about 80% of the area of the light beam is used to illuminate the photosite 320. In response to this amount of illumination, the light-activated circuit 312a emits a first RF signal having a particular frequency and amplitude that is associated with illumination of the wide cross member 374. The light-activated circuit 312a generates the first RF signal when the wide cross member 374 is illumined regardless of the rotational position of the photosite, since the light beam 236 is generally round.

As shown by the illumination outline 378b, when the light beam 236 illuminates a portion of the narrow cross member 370, about 40% of the area of the light beam is used to illuminate the photosite 320. In response to this amount of illumination, the light-activated circuit 312a emits a second RF signal with a particular frequency and amplitude that is associated with illumination of the narrow cross member 370. The light-activated circuit 312a generates the second RF signal when the narrow cross member 370 is illumined regardless of the rotational position of the photosite 320 since the light beam 236 is generally round.

As shown by the illumination outline 378c, when the light beam 236 illuminates the center of the photosite 320 about 90% of the area of the light beam is used to illuminate the photosite. In response to this amount of illumination, the light-activated circuit 312a emits a third RF signal with a particular frequency and amplitude that is associated with illumination of the center of the photosite 320. The light-activated circuit 312a generates the third RF signal when the center of the photosite 320 is illumined regardless of the rotational position of the photosite, since the light beam 236 is generally round.

The controller 212 processes the first RF signal, the second RF signal, and the third RF signal when determining the position of the photosite 320 and also when performing the angle-correction process. In particular, the controller 212 is able to calculate the skew angle (i.e angle θ2) of the semiconductor chip 300 simply by analyzing the signal from one of the photosites 320. For example, after the receiver 204 detects the first RF signal from the wide cross member 374 the controller 212 moves the spotter structure 196 to the position that is expected to generate the second RF signal from the narrow cross member 370. If the second RF signal is generated then the semiconductor chip 300 is not skewed. If, however, the second RF signal is not generated, the spotting structure 196 is moved in a controlled manner until the light beam 236 causes the light-activated circuit 312 to generate the second RF signal. The controller 212 stores the coordinates of the expected position and the actual position that results in the generation of the second RF signal. Then the controller 212 uses the distance between the expected position and the actual position to determine the skew angle (angle θ2) of the semiconductor chip 300.

In another embodiment, the junction of the cross member 370 and the cross member 374 is approximately the same size and shape as the light beam 236, such that when the light beam illuminates the center of the photosite 320 about 100% of the area of the light beam is used to illuminate the photosite.

Figure 14:
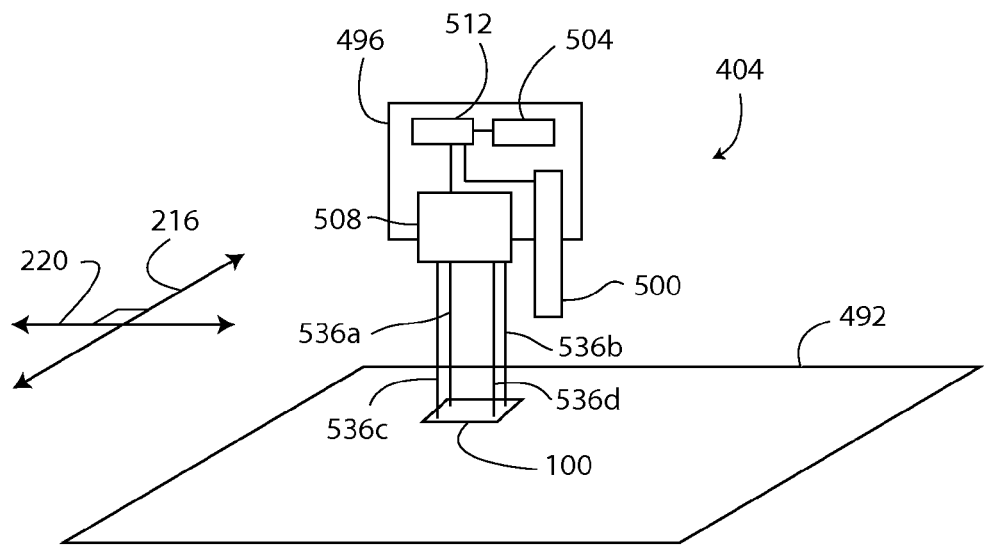
FIG. 14 is a top plan view showing the biochip of FIG. 1 positioned on another embodiment of the post-processing device that includes four light beams.

As shown in FIG. 14, the semiconductor chip 100 is positioned on another embodiment of the post-processing device 404. The post-processing device includes a table 492 and a spotting structure 496 positioned above the table. The table 492 defines a generally flat surface on which the semiconductor chip 100 is positioned. When the semiconductor chip 100 is positioned on the table 492, the semiconductor chip is prevented from moving relative to the table.

The spotting structure 496 includes a spotter 500, a receiver 504, a light source 508, and a controller 512 each of which are connected to the spotting structure. The spotting structure 596 is movable relative to the table 592 and the semiconductor chip 100 in the direction 216 and the direction 220.

The spotter 500 is electrically connected to the controller 512 and is configured to eject or jet biomaterial onto specific locations of the semiconductor chip 100, thereby forming the bio-probes 184 (FIG. 3).

The receiver 504 is electrically connected to the controller 512. The receiver 504 receives the RF signal generated by RF circuit 124. In response to receiving the RF signal, the receiver 504 generates a receiver output signal that is sent to the controller 512. The receiver 504 is configurable to generate the output signal in response to a certain frequency of the RF signal and/or a certain amplitude of the RF signal. Additionally, the receiver output signal is variable depending on the amplitude and frequency of the RF signal.

The light source 508 includes four of the light emitters 228 (FIG. 6) and four of the aperture pieces 232 (FIG. 6). Each of the light emitters 228 generates a focused light beam 536, such as a laser beam. The wavelength of the focused light beam 536 causes the photodiode 144 to generate a voltage, when the light beam illuminates one of the photosites 120. The light source 528 is electrically connected to the controller 512. In another embodiment, the four light beams 536 are formed from a single light source (not shown) having an aperture piece (not shown) with four apertures 240 (FIG. 7).

Figure 15:
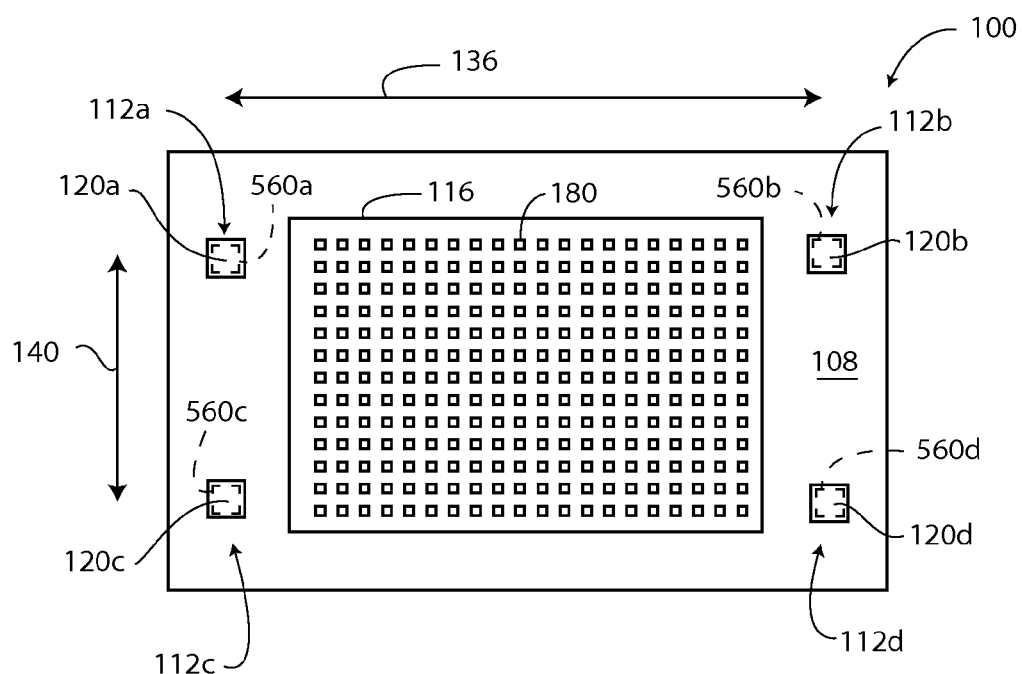
FIG. 15 is a top plan view showing the biochip and four different illumination outlines of the post-processing device of FIG. 14.

As shown in FIGS. 14 and 15, the light source 508 is configured such that the four light beams 536 illuminate the four photosites 120 of the semiconductor chip 100 simultaneously when the spotting structure 496 is accurately positioned with respect to the semiconductor chip, as shown by the illumination outlines 560. Accordingly, the distance between the light beam 536a and the light beam 536b is approximately equal to the distance 136. The distance between the light beam 536c and the light beam 536d is approximately equal to the distance 136. The distance between the light beam 536a and the light beam 536c is approximately equal to the distance 140. The distance between the light beam 536b and the light beam 536d is approximately equal to the distance 140.

The controller 512 is an electrical device that is connected to a motorized unit (not shown), which moves the spotting structure 596 in the direction 216 and the direction 220. The controller 512 generates electrical signals that cause the motorized unit to move the spotting structure 596 in a controlled manner. The controller 512 runs a program that enables the controller to determine the position of each of the electrodes 180 relative to the photosites 120.

In operation, the spotting structure 496 is used to align the spotter 500 with the biosensor array 116 by moving the spotting structure until the four light beams 536 illuminate the four photosites 120 simultaneously. Since there is only one orientation of the semiconductor chip 100 that results in the spotting structure 496 being positioned to illuminate the four photosites 120 simultaneously, the positioning and angle correction of the spotting structure are accomplished at the same time. Additionally, the light source 508, eliminates the need to disambiguate the position of the semiconductor chip 100, since there is only one orientation that results in the light beams 536 illuminating each of the photosites 120 simultaneously.

Figure 16:
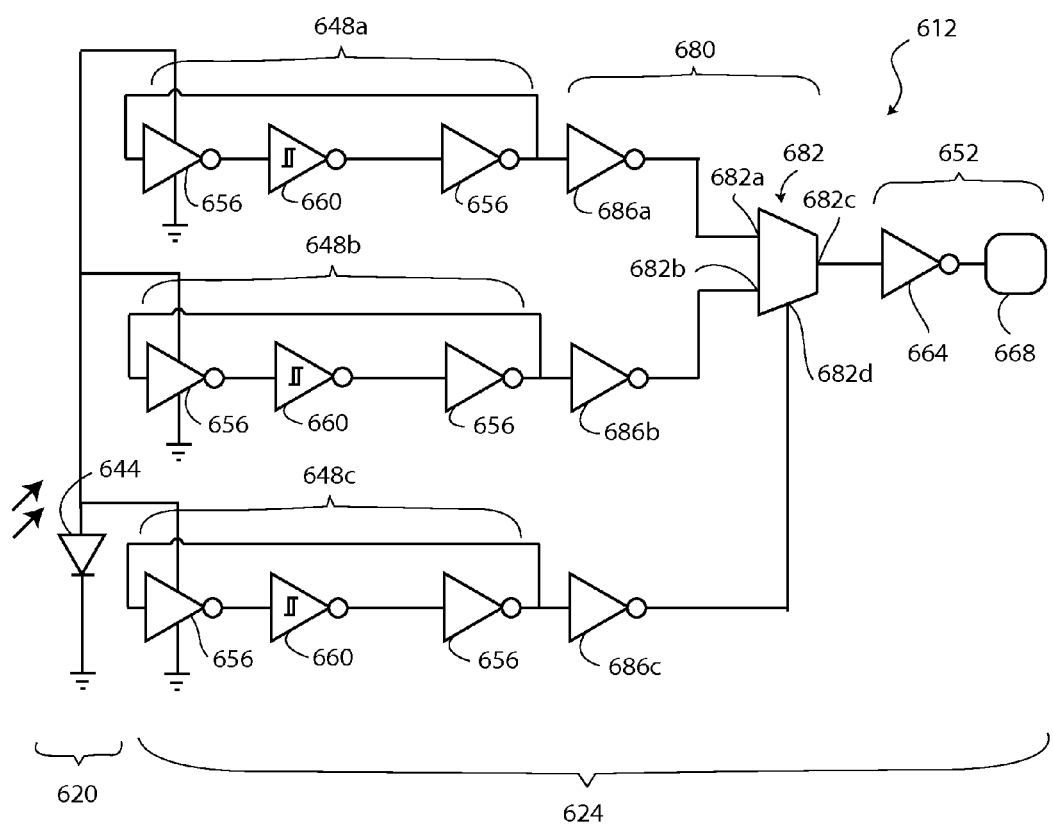
FIG. 16 is a schematic view of another light-activated circuit of a biochip suitable for use with the post-processing device of FIG. 1 or FIG. 14.

FIG. 16 shows another embodiment of a light-activated circuit 612 including a photosite 620 associated with an RF circuit 624. The photosite 620 includes a photodiode 644 configured in photovoltaic mode. The photodiode 644 is connected to the components of the RF circuit 624. The photodiode 644 supplies power to the RF circuit 624 when the photosite 620 is illuminated.

The RF circuit 624 includes three ring oscillators 648a, 648b, 648c, a multiplexor circuit 680, and an emitter circuit 652. Each of the ring oscillators 648 includes an odd number of components. In the illustrated embodiment, each of the ring oscillators 648 includes two inverters 656 and one Schmitt trigger 660; however, the ring oscillators may include any odd number of components in practice.

The multiplexor circuit 680 includes a multiplexor 682, an inverter 686a, an inverter 686b, and an inverter 686c. The multiplexor 682 includes an input channel 682a, an input channel 682b, an output channel 682c, and a selection channel 682d. When the selection channel 682d is at a first voltage level the output channel 682c is based on the input channel 682a. When the selection channel 682d is at a second voltage level the output channel 682c is based on the input channel 682b.

The input of each of the invertors 686 is connected to a respective one of the ring oscillators 648. The output of the invertor 686a is connected to the input channel 682a. The output of the invertor 686b is connected to the input channel 682b. The output of the invertor 686c is connected to the selection channel 682d.

The emitter circuit 652 includes an inverter 664 and an electrode 668. An output of the multiplexor 682 is connected to the input of the inverter 664. The output of the inverter 664 is connected to the electrode 668, which functions as an antenna. The electrode 668 is formed near the surface of the substrate 108 of the semiconductor chip. Accordingly, in response to illumination of the photosite 620, the RF circuit 624 emits a radio frequency signal from the electrode 668.

In operation, the RF circuit 624 generates an RF signal that has an amplitude and a frequency that is dependent on the illumination of the photosite 620. When the photosite 620 is at least partially illuminated, the ring oscillators 648 generate an oscillating output voltage. The oscillating output voltage of the ring oscillator 648c cause the multiplexor 680 to switch between outputting a signal based on the first input 682a and a signal based on the second input 682b. The output signal of the multiplexor 682 is emitted by the emitter 668 as an RF signal that is receivable by the receiver 204 (FIG. 1).

Figure 17:
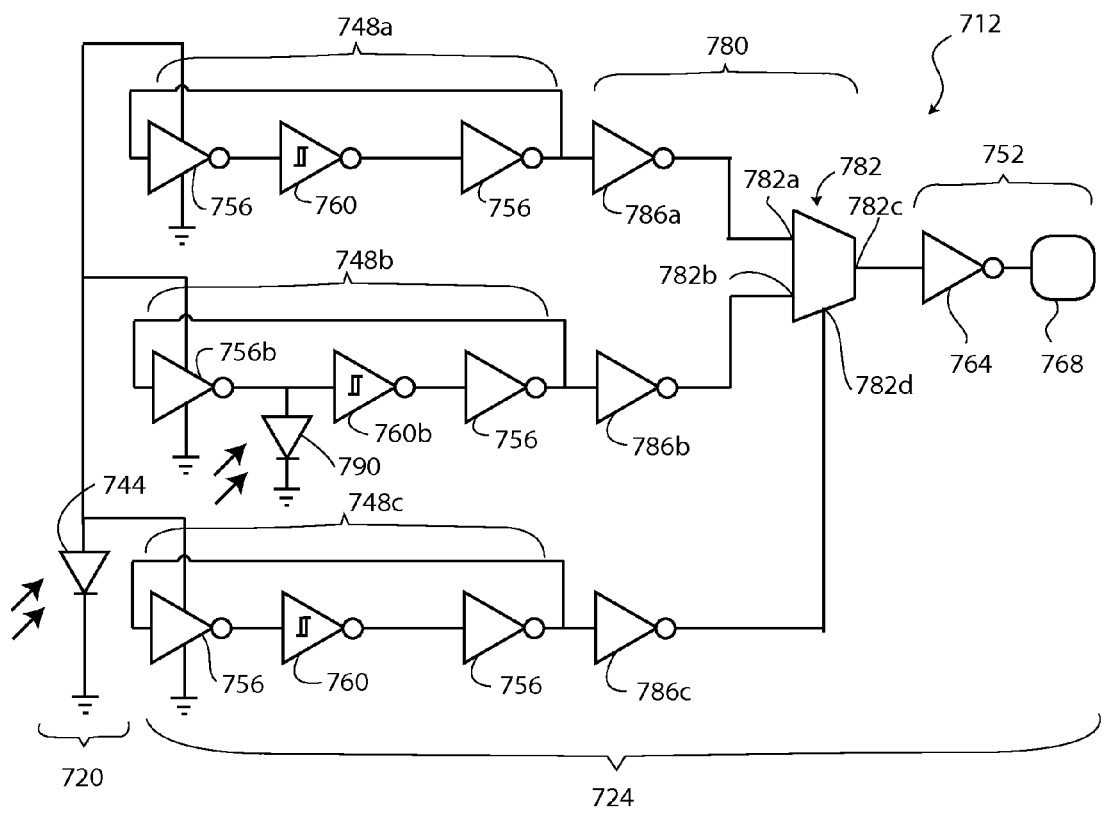
FIG. 17 is a schematic view of yet another light-activated circuit of a biochip suitable for use with the post-processing device of FIG. 1 or FIG. 14.

The output signal of the multiplexor 682 (and the emitter 668) is a frequency-shift keyed (FSK) signal. Use of the FSK signal improves the reliability of the receiver 204, because the FSK signal is easily detectable by the receiver since the FSK signal is more easily distinguished from noise. Additionally, the circuitry of the receiver 204 is less complex when the light-activated circuit 612 emits an FSK signal. In other embodiments, other modulation schemes e.g., CDMA are used in addition to or in place of the FSK modulation. In some embodiments, different codes are used to differentiate different sites, different parts or different batches FIG. 17 shows another embodiment of a light-activated circuit 712 including a photosite 720 associated with an RF circuit 724. The photosite 720 includes a photodiode 744 configured in photovoltaic mode. The photodiode 744 is connected to the components of the RF circuit 724. The photodiode 744 supplies power to the RF circuit 724 when the photosite is illuminated.

The RF circuit 724 includes three ring oscillators 748a, 748b, 748c, a multiplexor circuit 780, and an emitter circuit 752. Each of the ring oscillators 748 includes an odd number of components. In the illustrated embodiment, each of the ring oscillators 748 includes two inverters 756 and one Schmitt trigger 760; however, the ring oscillators may include any odd number of components in practice.

In addition to the components described above, the ring oscillator 748b includes a photo diode 790 configured in photovoltaic mode. The anode of the photodiode 790 is connected to the output of the inverter 756b and to the input of the Schmitt trigger 760b. The cathode of the photodiode 790 is connected to circuit ground. In another embodiment of the light-activated circuit 712 (shown in FIG. 18) the anode of the photodiode 790 is connected to circuit ground, and the cathode of the photodiode is connected to the output of the inverter 756b and to the input of the Schmitt trigger 760b.

The photodiode 790 receives illumination from the photosite 720. Alternatively, the photodiode 790 has a separate photosite (not shown) from which to receive illumination.

The multiplexor circuit 780 includes a multiplexor 782, an inverter 786a, an inverter 786b, and an inverter 786c. The multiplexor 782 includes an input channel 782a, an input channel 782b, an output channel 782c, and a selection channel 782d. When the selection channel 782d is at a first voltage level the output channel 782*c* is based on the input channel 782*a*. When the selection channel 782*d* is at a second voltage level the output channel 782*c* is based on the input channel 782*b*.

The input of each of the invertors 786 is connected to a respective one of the ring oscillators 748. The output of the invertor 786*a* is connected to the input channel 782*a*. The output of the invertor 786*b* is connected to the input channel 782*b*. The output of the invertor 686*c* is connected to the selection channel 682*d*.

The emitter circuit 752 includes an inverter 764 and an electrode 768. An output of the multiplexor 782 is connected to the input of the inverter 764. The output of the inverter 764 is connected to the electrode 768, which functions as an antenna. The electrode 768 is formed near the surface of the substrate 108 of the semiconductor chip. Accordingly, in response to illumination of the photosite 720, the RF circuit 724 emits a radio frequency signal from the electrode 768

Figure 18:
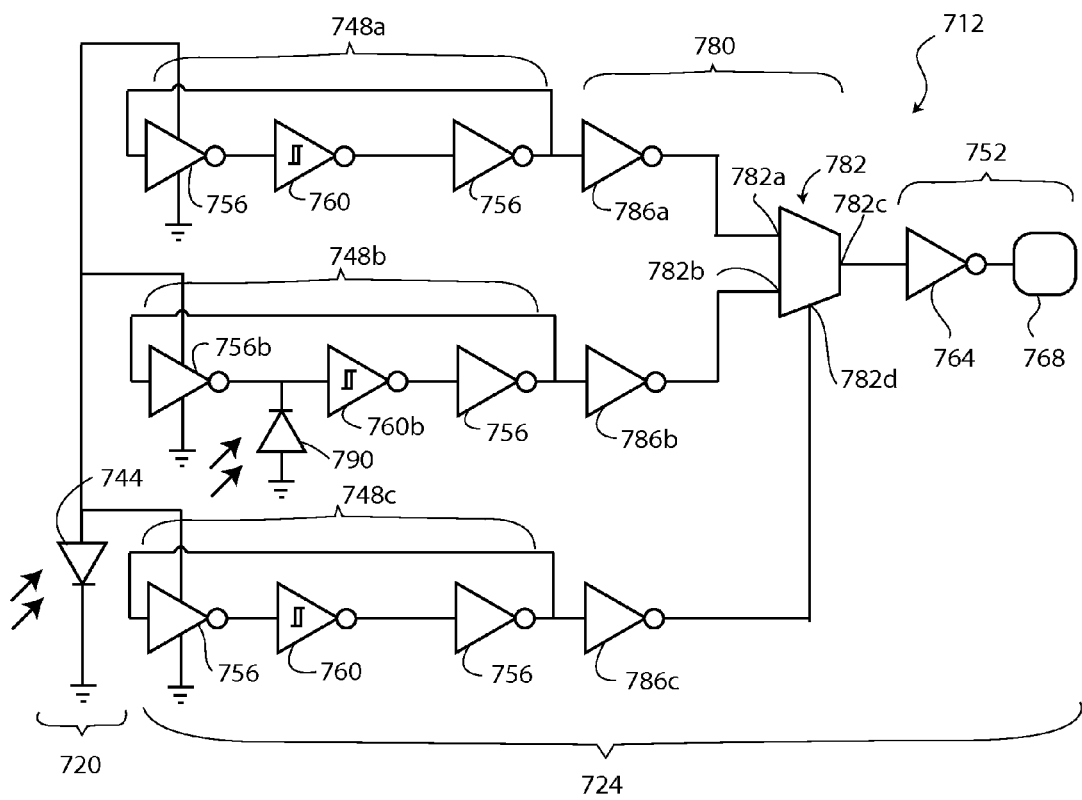
FIG. 18 is a schematic view of still another light-activated circuit of a biochip suitable for use with the post-processing device of FIG. 1 or FIG. 14.

The photodiode 790 in the embodiments shown in FIGS. 17 and 18, supplies voltage having either a negative amplitude or a positive amplitude to the ring oscillator 648*b*, with the result that the frequency of the output signal generated by the ring oscillator 648*b* is dependent on the amount of illumination to which the photodiode 790 is subjected to. It is noted that in some embodiments the photodiode 790 is made by exposing the parasitic diodes (not shown) of the gate transistors of the invertor 656*b* and/or the Schmitt trigger 660*b*.

Figure 19:
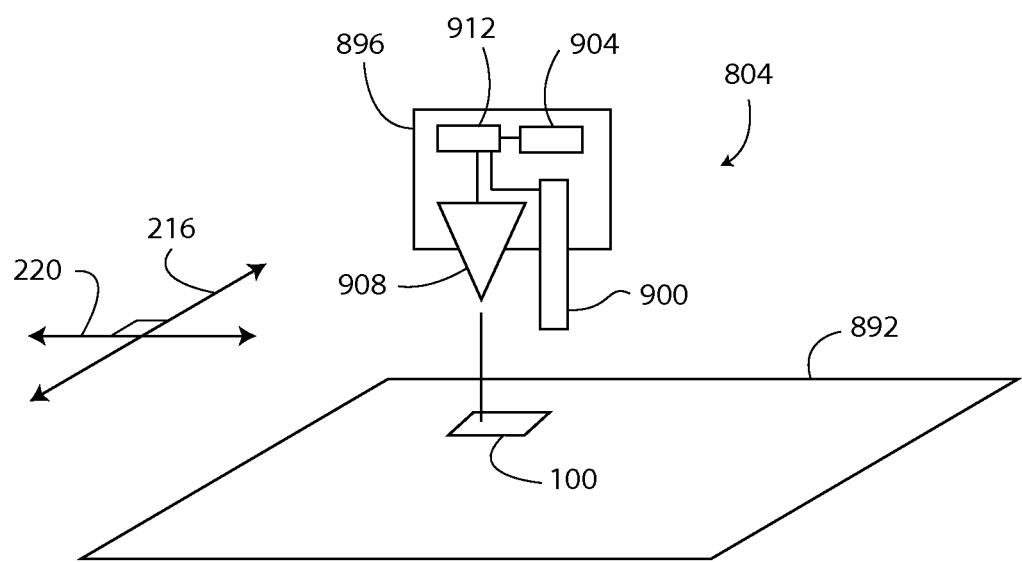
FIG. 19 is a block diagram of the biochip of FIG. 1 and another embodiment of a post-processing device.

As shown in FIG. 19, the semiconductor chip 100 is positioned on a post-processing device identified generally as 804. The post-processing device 804 includes a table 892 and a label apparatus 896 positioned above the table. The table 892 defines a generally flat surface on which the semiconductor chip 100 is positioned. When the semiconductor chip 100 is positioned on the table 192, the semiconductor chip is prevented from moving relative to the table.

The label apparatus 896 includes a label reader 900, a receiver 904, a light source 908, and a controller 912 each of which are connected to the label apparatus. A motorized unit (not shown) is provided to move the label apparatus relative to the table 892 and the semiconductor chip 100 in the direction 216 and the direction 220.

The label reader 900 is configured to read a label (not shown) that is bound in an antibody (not shown) deposited on one of the bio-probes 184 (FIG. 3). The label reader 900 is included along with the other components of the post-processing device 804.

Using the alignment process described above, the post-processing device 804 automatically aligns itself in the proper orientation for the label reader 900 to detect the presence of labels on the bioprobes 184. In particular, after the controller 912 determines the position of the semiconductor chip 100, the label reader 900 is positioned near a particular one of the bio-probes 184 to determine a concentration of labels (if any) that are present in the antibody deposited onto the bio-probe. Depending on the type of label present in the antibody, the label reader 900 detects the labels using colorimetry, amperometry, magnetometry, voltammetry, luminescence, and/or fluorescence.

In another embodiment of the semiconductor chip 100 the photosites 120 are provided in any shape that is particularly suited to aligning the post-processing device 104 with the semiconductor chip. For example, the photosites 120 have a generally circular shape, a rectangular shape, a symmetrical cross shape, a barcoded shape, or the shape of any polygon. Furthermore, the aperture 240 causes the light beam 236 to be emitted from the light source 208 in any shape, including any shape that is complementary to the shape of the photosites 120. The different shapes of the photosites 120 and the light beam 236 improve the precision of detection of the RF signal generated by the light-activated circuit 112. By matching the aperture of the illuminator on the spotter and spatial code of the photosite the position accuracy is improved and errors (e.g, due to ambient light) are reduced.

In yet another embodiment, the semiconductor chip 100 includes a first photosite 120 having a first shape and a second photosite 320 having a second shape that is different from the first shape. For example, a semiconductor chip 100 includes two of the photosites 120 shown in FIG. 2 and two of the photosites 320 shown in FIG. 11. In this example, the light source 208 is configurable to pass a first light beam in a shape that is complementary to the shape of the photosite 120 and to pass a second light beam in a shape that is complementary to the shape of the photosite 320.

In another embodiment, to disambiguate the semiconductor chip 100, the spotting structure 196 moves in a pattern that encompasses the entire area in which the semiconductor chip may be positioned. During the movement, the light source 208 emits a wide area light beam (not shown) that illuminates an area of the table 192 and the semiconductor chip 100 that is larger than the area of the photosites 120. Also during the movement, the controller 212 stores the positions that results in peaks of RF signal being emitted from the RF circuitry powered by the photosites 120. The peaks of RF signal are associated with the approximate positions of the photosites 120. Thereafter, the spotting structure 196 is moved to the locations corresponding to the peaks and the exact position of each photosite 120 is determined using the light beam 236.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A method of aligning a semiconductor chip comprising:
    forming a semiconductor chip with a light-activated circuit including an RF circuit and at least one photosite;
    positioning the semiconductor chip relative to a device;
    illuminating the at least one photosite of the positioned semiconductor chip;
    generating an RF signal with the RF circuit based upon illumination of the at least one photosite, wherein the RF signal includes data indicative of an intensity of the illumination as the intensity of the illumination of the at least one photosite varies over non-zero values; and
    determining the position of the photosite with respect to the device based upon the variation in intensity as indicated by the data of the generated RF signal.

2. The method of claim 1, wherein determining the position comprises determining a two-dimensional orientation of the photosite with respect to the device.

3. The method of claim 1, wherein:
    forming a semiconductor chip comprises forming a first photosite of the at least one photosite with a first shape; and
    illuminating the positioned semiconductor chip comprises illuminating the positioned semiconductor chip with a first light beam having a second shape complementary to the first shape.

4. The method of claim 3, wherein the first shape is generally cross-shaped.

5. The method of claim 3, wherein:
forming a semiconductor chip comprises forming a second photosite of the at least one photosite with the first shape; and
illuminating the positioned semiconductor chip comprises illuminating the positioned semiconductor chip with a second light beam having the second shape.

6. The method of claim 5, wherein:
the first photosite has first orientation with respect to a substrate of the semiconductor chip;
the second photosite has second orientation with respect to the substrate of the semiconductor chip; and
the first orientation is different from the second orientation.

7. The method of claim 3, wherein:
forming a semiconductor chip comprises forming a second photosite of the at least one photosite with a third shape;
illuminating the positioned semiconductor chip comprises illuminating the positioned semiconductor chip with a third light beam having the third shape; and
the third shape is different from the first shape.

8. The method of claim 1, wherein forming a semiconductor chip comprises:
forming a waveguide associated with the at least one photosite.

9. The method of claim 8, wherein forming a waveguide comprises:
forming a waveguide configured to pass a shaped beam of light.

10. The method of claim 1, wherein forming a semiconductor chip comprises:
forming a first ring oscillator operatively connected to at least one of the at least one photosite.

11. The method of claim 10, wherein:
forming a semiconductor chip comprises forming a second ring oscillator and a third ring oscillator; and
generating an RF signal comprises generating a frequency shift keyed signal.

12. The method of claim 1, wherein the device is a printing machine.

13. The method of claim 1, wherein the device is a label reader.

14. The method of claim 1 wherein the light activated circuit includes an optical filter.

15. The method of claim 14, wherein the optical filter is a color filter.

16. The method of claim 1, further comprising:
matching an illuminator special pattern to the at least one photosite.

17. The method of claim 1, wherein generating the RF signal comprises:
shifting an oscillator frequency based upon a voltage produced by the at least one photosite.

* * * * *